(12) United States Patent
Ll

(10) Patent No.: US 7,583,148 B2
(45) Date of Patent: Sep. 1, 2009

(54) TRANSCONDUCTANCE CONTROL CIRCUIT, METHOD OF CONTROLLING TRANSCONDUCTANCE, AND A POWER AMPLIFIER

(75) Inventor: Kim Ll, Sheffield (GB)

(73) Assignee: Jennic Limited, Sheffield (GB)

( * ) Notice: Subject to any disclaimer, the term of this patent is extended or adjusted under 35 U.S.C. 154(b) by 230 days.

(21) Appl. No.: 11/685,606

(22) Filed: Mar. 13, 2007

(65) Prior Publication Data

US 2008/0224780 A1 Sep. 18, 2008

(51) Int. Cl.
*H03F 1/26* (2006.01)
(52) U.S. Cl. .................. 330/266; 330/267; 330/289; 330/285
(58) Field of Classification Search .......... 330/266, 330/267, 289, 285
See application file for complete search history.

(56) References Cited

U.S. PATENT DOCUMENTS 7,230,494 B1 * 6/2007 Jin et al. ................ 330/289
2008/0224780 A1 * 9/2008 Li ........................ 330/285

* cited by examiner

*Primary Examiner*—Michael B Shingleton
(74) *Attorney, Agent, or Firm*—Wilmer Cutler Pickering Hale & Dorr LLP.

(57) ABSTRACT

A transconductance control circuit, comprising: a test transconductance circuit for providing an output current from a reference voltage; apparatus for deriving a bias current for the test transconductance circuit from the output current, the bias current including a component that varies with temperature and a component that varies with process; and apparatus for providing the bias current to other transconductance circuits.

19 Claims, 4 Drawing Sheets

TRANSCONDUCTANCE CONTROL CIRCUIT, METHOD OF CONTROLLING TRANSCONDUCTANCE, AND A POWER AMPLIFIER

FIELD OF THE INVENTION

Embodiments of this invention relate to a transconductance control circuit, method of controlling transconductance, and a power amplifier.

BACKGROUND TO THE INVENTION

Transistor-based circuits, such as, for example, power amplifiers, are sensitive to variations in temperature and chip manufacturing process. The transconductance ($g_m$) of a transconductance circuit (such as, for example, a transistor) in a transistor-based circuit may vary by up to around 15% as the temperature of the circuit is varied from −40° C. to 100° C. The transconductance may vary by up to 30% due to variations in chip manufacturing process, which is referred to hereinafter as "process".

FIG. 1 shows a power amplifier 100. The power amplifier 100 includes a transconductance circuit 102 that produces an output current $i_{out}$ from an input voltage $v_{in}$. A bias current $i_{bias}$ for the transconductance circuit 102 controls the transconductance $g_m$ of the transconductance circuit 102. A load impedance 104 is connected between the output of the transconductance circuit 102 and a power supply voltage $V_{dd}$. The voltage at the output of the transconductance circuit 102 comprises the output voltage $v_{out}$. The gain of the power amplifier is given by $g_m Z_L$, where $Z_L$ is the effective impedance of the load 104 at the frequency of operation.

The transconductance of the transconductance circuit 102 varies with temperature and process as indicated above. Furthermore, the impedance of the load 104 tends to decrease as the temperature increases. These changes cause the gain of the power amplifier 100 to change as the temperature changes, which is undesirable where the gain of the power amplifier 100 is required to be substantially constant.

It is an object of embodiments of the invention to at least mitigate one or more of the problems of the prior art.

SUMMARY OF THE INVENTION

According to a first aspect of embodiments of the invention, there is provided a transconductance control circuit, comprising: a test transconductance circuit for providing an output current from a reference voltage; apparatus for deriving a bias current for the test transconductance circuit from the output current, the bias current including a component that varies with temperature and a component that varies with process; and apparatus for providing the bias current to other transconductance circuits.

Thus, the transconductance $g_m$ of a transconductance circuit can be controlled with respect to temperature and process. Furthermore, with appropriate selection of components in the bias current, the transconductance of the test transconductance circuit can be controlled to compensate for other effects of temperature and/or process variations. For example, the transconductance may be controlled to compensate for a reduced load impedance in a power amplifier as the temperature rises.

In certain embodiments, the bias current includes a component independent of temperature and process. The relative magnitudes of the component that varies with temperature and the component independent of temperature and process may be selectable. The rate at which the transconductance of the transconductance circuit changes with temperature can, therefore, be varied. The rate can be selected, for example, to compensate for a reduction in load impedance of a power amplifier due to a rise in temperature.

In certain embodiments, the apparatus for deriving the bias current comprises apparatus for determining a difference current representing the difference between the output current and a reference current, the reference current including a component that varies with temperature, and a current amplifier for amplifying the difference current to produce the bias current. Thus, the transconductance of the amplifier can be maintained close to $i_{ref}/V_{ref}$ where $i_{ref}$ is the reference current and $V_{ref}$ is the reference voltage. The transconductance of the transconductance circuit can therefore be controlled using the reference current. The transconductance is, therefore, substantially independent of process.

In certain embodiments, the apparatus for providing the bias current to one or more other transconductance circuits comprises at least one current mirror. Therefore, the transconductance of one or more other transconductance circuits can also be controlled, and can be, for example, independent of temperature and process, or independent of process and controlled with respect to temperature to compensate for a reduction in power amplifier load impedance with a rise in temperature.

In certain embodiments, the reference voltage is a differential voltage and the test transconductance circuit is a differential circuit that produces the output current from the differential reference voltage, wherein the output current is a differential current. Such an arrangement has improved noise performance when compared with a single-ended arrangement.

According to a second aspect of embodiments of the invention, there is provided a method of controlling gain of a transconductance circuit, comprising: producing an output current from a reference voltage using a test transconductance circuit; deriving a bias current for the test transconductance circuit from the output current, wherein the bias current includes a component that varies with temperature and a component that varies with process; and providing the bias current to other transconductance circuits.

According to a third aspect of embodiments of the invention, there is provided a power amplifier, comprising: a power transconductance circuit; a load impedance; and a gain control circuit, comprising: a test transconductance circuit for providing an output current from a reference voltage; apparatus for deriving a bias current for the transconductance circuit, the bias current including a component that varies with temperature and a component that varies with process; and apparatus for providing the bias current to the power transconductance circuit to control the gain of the power amplifier.

According to a fourth aspect of embodiments of the invention, there is provided a power amplifier comprising: a power transconductance circuit; a load impedance; and a gain control circuit, comprising: a test transconductance circuit for providing an output current from a reference voltage; apparatus for subtracting the output current from a reference current to produce an error current, wherein the reference current includes a component that varies with temperature and a component independent of temperature and process; a current amplifier for amplifying the error current to produce the bias current; and a current mirror for providing the bias current to the power transconductance circuit to control the gain of the power amplifier; wherein the relative magnitudes of the component that varies with temperature and the component independent of temperature and process are selected such that the gain of the power amplifier is substantially independent of temperature and process.

According to a fifth aspect of embodiments of the invention, there is provided a transconductance control circuit, comprising: a test transconductance circuit for producing an output current $i_{ref}$ from a reference voltage $V_{ref}$; apparatus for determining an error current representing a difference between the output current and a reference current; an amplifier for amplifying the error current to produce a bias voltage for the test transconductance circuit; and apparatus for providing the bias current to other transconductance circuits; wherein the transconductance of the transconductance circuit is maintained at substantially $i_{ref}/V_{ref}$.

BRIEF DESCRIPTION OF THE DRAWINGS

Embodiments of the invention will now be described by way of example only, with reference to the accompanying drawings, in which.

DETAILED DESCRIPTION OF EMBODIMENTS OF THE INVENTION

Figure 2:
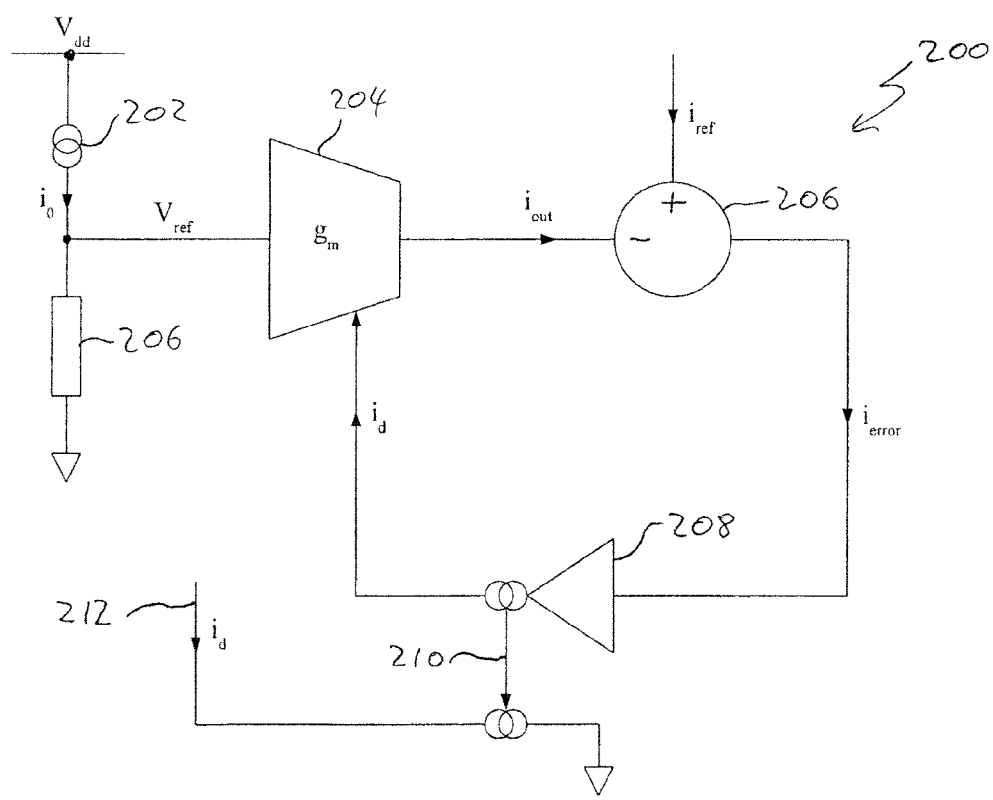
FIG. 2 shows an overview of an embodiment of the invention.

The circuit 200 of FIG. 2 shows a current source 202 connected between a power supply voltage $V_{dd}$ and the input of a test transconductance circuit 204. A resistor 206 is connected between the input of the test transconductance circuit 204 and ground. The current source 202 generates a current $i_0$, and hence a reference voltage $V_{ref}$ is presented to the input of the test transconductance circuit 204.

The test transconductance circuit 204 produces an output current $i_{out}$ from the reference voltage $V_{ref}$ such that:

$$i_{out} = V_{ref} g_m \quad (1)$$

where $g_m$ is the transconductance of the test transconductance circuit 204. The transconductance $g_m$ is dependent on the bias current $i_d$ provided to the test transconductance circuit 204.

Figure 1:
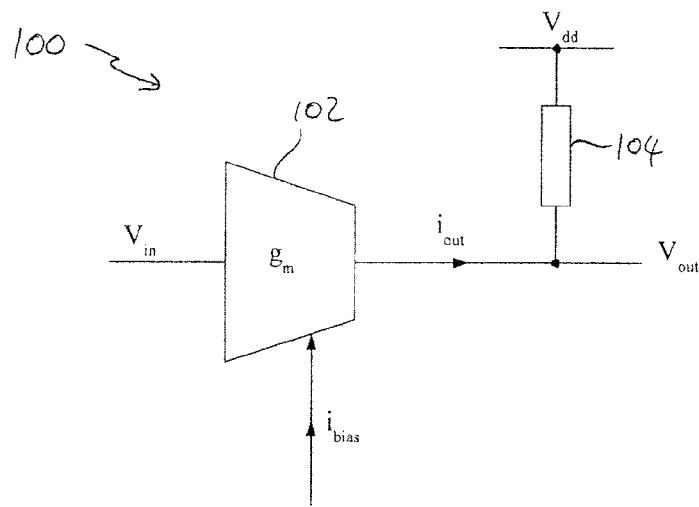
FIG. 1 shows a known power amplifier.

The output current $i_{out}$ is subtracted from a reference current $i_{ref}$ at a node 206, resulting in an error current $i_{error}$. The error current is amplified by a current amplifier 208 to produce the bias current $i_d$ for the test transconductance circuit 204. The bias current $i_d$ may be mirrored using one or more current mirrors and provided to other transconductance circuits in order to control their transconductance. A current mirror 210 is shown in FIG. 1, and the bias current $i_d$ through a node 212 can be provided to another transconductance circuit, such as the transconductance circuit 102 in the power amplifier 100 shown in FIG. 1.

If the gain of the amplifier 208 is much greater than unity, then the transconductance of the test transconductance circuit is maintained close to $i_{ref}/V_{ref}$ as $i_{out}$ is maintained close to $i_{ref}$. The transconductance $g_m$ of the test transconductance circuit is, therefore, independent of process if the reference current $i_{ref}$ is independent of process and/or $V_{ref}$ is independent of process. If the transconductance control current $i_d$ is supplied to other transconductance circuits on the same chip, for example, then the transconductance of the other transconductance circuits will also be independent of process. This is because the variations in transistor and transconductance circuit electrical characteristics tend to be affected substantially equally across the chip due to process variations.

The reference current $i_{ref}$ includes a component $i_{PTAT}$ proportional to absolute temperature, and a component $i_{fixed}$ that is constant, i.e. independent of temperature and process, such that:

$$i_{ref} = i_{PTAT} + i_{fixed} \quad (2)$$

The transconductance $g_m$ of the test transconductance circuit 204 is, therefore, approximated by:

$$g_m = (i_{PTAT} + i_{fixed})/V_{ref} \quad (3)$$

Figure 3:
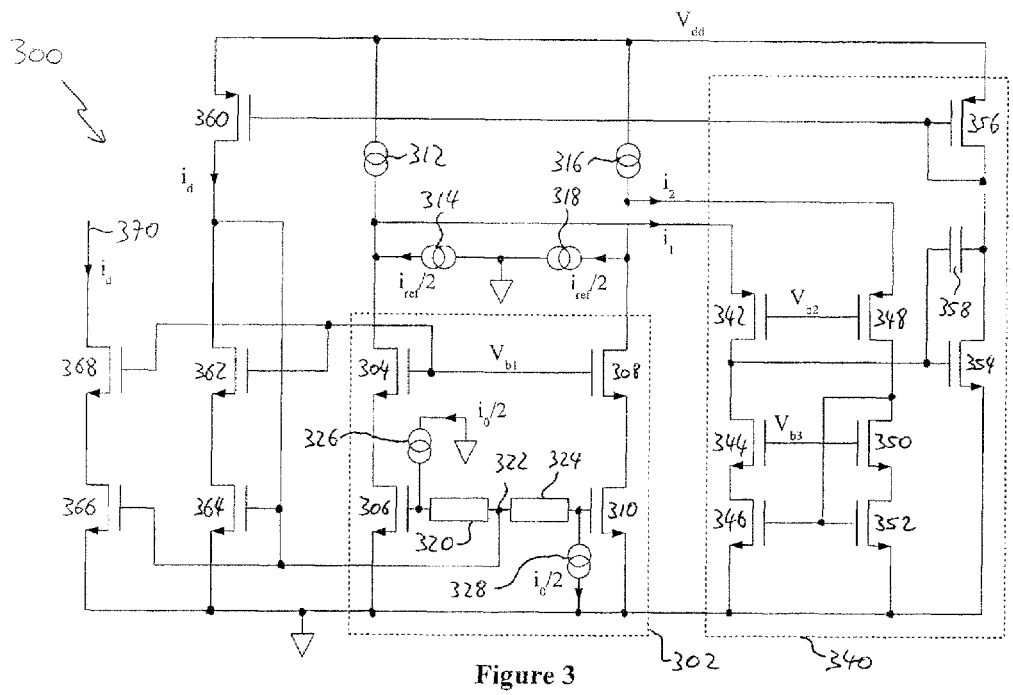
FIG. 3 shows an embodiment of the invention in more detail.

FIG. 3 shows an example of an implementation of the circuit 200 of FIG. 2 in more detail. The circuit 300 shown in FIG. 3 comprises a test transconductance circuit 302 comprising four n-type transistors 304, 306, 308 and 310.

The source of the transistor 304 is connected to the drain of the transistor 306. The source of the transistor 308 is connected to the drain of the transistor 310. The sources of the transistors 306 and 310 are connected to ground.

A current source 312 is connected between the power supply voltage $V_{dd}$ and the drain of the transistor 304. A current source 314 is also connected to and provides a half reference current $i_{ref}/2$ to the drain of the transistor 314. Similarly, a current source 316 is connected between the power supply voltage $V_{dd}$ and the drain of the transistor 308. A current sink 318 is also connected to and sinks a half reference current $i_{ref}/2$ from the drain of the transistor 314.

The gates of the transistors 304 and 308 are biased with a bias voltage $V_{b1}$. A resistor 320 is connected between the gate of the transistor 306 and a node 322. A resistor 320, of the same value as the resistor 324, is connected between the node 322 and the gate of the transistor 310. A current source 326 provides a current $i_0/2$ to the node at the gate of the transistor 306. A current sink 328 sinks a current $i_0/2$ from the node at the gate of the transistor 310.

The test transconductance circuit 302 is a differential transconductance circuit that provides differential output currents $i_1$ and $i_2$ from nodes at the drains of the transistors 304 and 308 respectively. The output currents $i_1$ and $i_2$ are produced from voltages at the nodes corresponding to the gates of the transistors 306 and 310 respectively. The differential currents $i_1$ and $i_2$ are provided to a differential current amplifier 340 that determines and amplifies the difference between the currents $i_1$ and $i_2$.

The current $i_1$ is provided to the source of a p-type transistor 342. The drain of the transistor 342 is connected to the drain of a n-type transistor 344. The source of the transistor 344 is connected to the drain of a n-type transistor 346. The source of the transistor 346 is connected to ground.

The current $i_2$ is provided to the source of a p-type transistor 348. The drain of the transistor 348 is connected to the drain of a n-type transistor 350. The source of the transistor 350 is connected to the drain of a n-type transistor 352. The source of the transistor 352 is connected to ground.

The gates of the transistors 342 and 348 are provided with a bias voltage $V_{b2}$. The gates of the transistors 344 and 350 are provided with a bias voltage $V_{b3}$. The gates of the transistors 346 and 352 are connected to the node connected to the drains of the transistors 348 and 350.

The node connected to the drains of the transistors 342 and 344 is connected to the gate of a n-type transistor 354. The source of the transistor 354 is connected to ground, and the drain is connected to the drain of a p-type transistor 356. The source of the transistor 356 is connected to the power supply voltage $V_{dd}$. A Miller compensating capacitor 358 is connected between the gate and drain of the transistor 354 to ensure stability of the closed loop feedback system.

The gate of the transistor 356 is connected to the drain of the transistor 356, and is also connected to the gate of a p-type transistor 360. The current $i_d$ passing through the transistor 356 is therefore mirrored through the transistor 360. The source of the transistor 360 is connected to the power supply voltage $V_{dd}$. The drain of the transistor 360 is connected to the drain of a n-type transistor 362. The source of the n-type transistor 362 is connected to the drain of a n-type transistor 364. The source of the transistor 364 is connected to ground.

The bias voltage $V_{b1}$ is provided to the gate of the transistor 362. The drain of the transistor 360 is connected to the gate of the transistor 364, and is also connected to the node 322 within the test transconductance circuit 302. The drain of the transistor 360 is also connected to the gate of a n-type transistor 366. The source of the transistor 366 is connected to ground, and the drain is connected to the source of a n-type transistor 368. The bias voltage $V_{b1}$ is provided to the gate of the transistor 368.

The transistors 362, 364, 366 and 368 form a current mirror arrangement that mirrors the current $i_d$ through the transistors 366 and 368. The drain of the transistor 368 forms an output node 370 that may be connected to one or more other transconductance circuits to control their transconductance. For example, the node 370 may be used to bias the transconductance circuits. One or more additional current mirrors (such as, for example, pairs of transistors connected in the same way as transistors 366 and 368) may be provided to create further output nodes for controlling the transconductance of other transconductance circuits.

Figure 4:
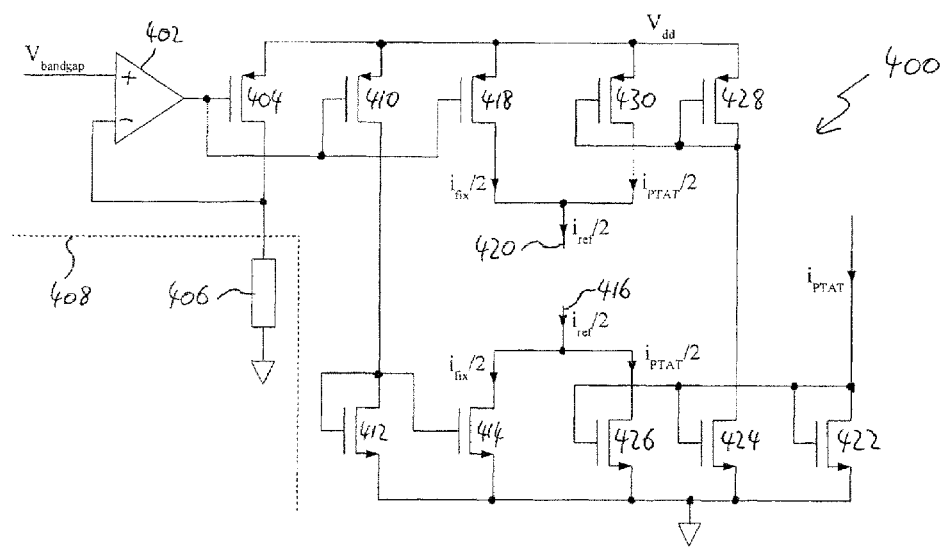
FIG. 4 shows an embodiment of a circuit to supply a reference current.

FIG. 4 shows an example of a circuit 400 implementing the current sources 314 and 318 shown in FIG. 3 that source and sink the $i_{ref}/2$ current respectively. The circuit 400 includes an op-amp 402. A constant voltage $V_{bandgap}$ is provided to the non-inverting input of the op-amp 402. The voltage $V_{bandgap}$ is provided by a bandgap circuit and is independent of process, temperature and supply voltage. An example of a bandgap circuit is given in J. R. Wildar, "*New Developments in IC Voltage Regulators*", IEEE J. Solid State Circuits, SC-6, 2-7, 1971, the contents of which are incorporated herein in their entirety by reference.

The output of the op-amp 402 is connected to the gate of a p-type transistor 404. The source of the transistor is connected to the power supply voltage $V_{dd}$, and the drain is connected to the inverting input of the op-amp 402. A resistor 406 is connected between the drain of the transistor 404 and ground. The resistor is off-chip, as indicated by the chip boundary 408. Having the resistor 406 external reduces the silicon area of the circuit 400 and allows a user to implement a resistor that is substantially constant with variations in temperature. The size of the resistor 406 may also be selected to select the magnitude of the current $i_{ref}/2$. In alternative embodiments, however, an on-chip resistor may be used if desired.

The output of the op-amp 402 is connected to the gate of a p-type transistor 410. The source of the transistor 410 is connected to the power supply voltage $V_{dd}$. The drain of the transistor 410 is connected to the gate and drain of a n-type transistor 412 and the gate of a n-type transistor 414. The sources of the transistors 412 and 414 are connected to ground. The drain of the transistor 414 is connected to a node 416.

The output of the op-amp 402 is also connected to the gate of a p-type transistor 418. The source of the transistor 418 is connected to the power supply voltage $V_{dd}$. The drain of the transistor 418 is connected to a node 420.

A current $i_{PTAT}$ is provided to the circuit 400 by the bandgap circuit. The current $i_{PTAT}$ is substantially proportional to $(293+\Delta T)/293$, where $\Delta T$ is the change in temperature from 293 K. Therefore, the current $i_{PTAT}$ is substantially proportional to absolute temperature, and is independent of process and supply voltage. The current $i_{PTAT}$ is provided to the drain of a n-type transistor 422. The source of the transistor is connected to ground. The gate of the transistor 422 is connected to the drain of the transistor 422, and also to the gates of two n-type transistors 424 and 426. The sources of the transistors 424 and 426 are connected to ground. The drain of the transistor 426 is connected to the node 416.

The drain of the transistor 424 is connected to the gate and drain of a p-type transistor 428, and also to the gate of a p-type transistor 430. The sources of the transistors 428 and 430 are connected to the power supply voltage $V_{dd}$. The drain of the transistor 430 is connected to the node 420.

When the circuit 400 is in operation, the op-amp 402 maintains the voltage at the drain of the transistor 404 substantially at the bandgap voltage $V_{bandgap}$. A current then flows through the transistor 404 and off-chip resistor 406. A current $i_{fixed}/2$ is induced through the transistor 418 and also through the transistor 414. A current $i_{PTAT}/2$ is induced through the transistor 430, and also through the transistor 426. The node 420 is connected to the drain of the transistor 304 shown in FIG. 3, and the node 416 is connected to the drain of the transistor 308. As a result, the node 420 provides a current $i_{ref}/2=i_{fixed}/2+i_{PTAT}/2$ to the drain of the transistor 304. The node 416 sinks the current $i_{ref}/2$ from the drain of the transistor 308. The current $i_{ref}/2$ includes a component $i_{fixed}/2$ that is independent of process, supply voltage and temperature, and a component $i_{PTAT}/2$ that is substantially proportional to absolute temperature, and is independent of process and supply voltage.

Figure 5:
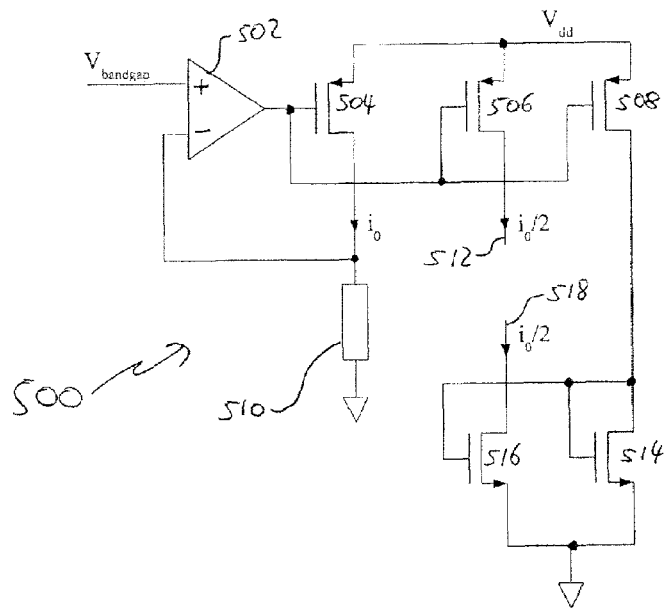
FIG. 5 shows an embodiment of a circuit to supply a constant current.

FIG. 5 shows an example of a circuit 500 implementing the current sources 326 and 328 shown in FIG. 3 that source and sink the $i_0/2$ current respectively. The circuit includes an op-amp 502. The bandgap voltage $V_{bandgap}$ is provided to the non-inverting input of the op-amp 502. The output of the op-amp 502 is connected to the gate of p-type transistors 504, 506 and 508. The sources of the transistors 504, 506 and 508 are connected to the power supply voltage $V_{dd}$. The drain of the transistor 504 is connected to the inverting input of the op-amp 502. A resistor 510 is connected between the drain of the transistor 504 and ground. The resistor 510 is an on-chip resistor whose resistance varies in substantially the same amount as the on-chip resistors 320 and 324 shown in FIG. 3.

The drain of the transistor 506 is connected to a node 512. The node 512 is connected to the node at the gate of the transistor 306 shown in FIG. 3. The drain of the transistor 508 is connected to the gate and drain of a n-type transistor 514, and also to the gate of a n-type transistor 516. The sources of the transistors 514 and 516 are connected to ground, and the drain of the transistor 516 is connected to a node 518. The node 518 is connected to the node at the gate of the transistor 310 shown in FIG. 3.

In operation, the op-amp maintains the voltage at the drain of the transistor 504 substantially at the bandgap voltage $V_{bandgap}$. A current $i_0$ is induced through the transistor 504 and resistor 510. As a result, a current $i_0/2$ is induced through the transistor 506, and also through the transistor 516. The current $i_0/2$ is, therefore, provided to the node at the gate of the transistor 306, and sunk from the gate of the transistor 310. The current $i_0/2$ is independent of supply voltage. $i_0$ tracks the current required to produce the same voltage across the resistors 320 and 324 shown in FIG. 3. These resistors 320 and 324 and the resistor 510 shown in FIG. 5 are all on the same chip and are therefore subject to the same process and temperature variation.

Therefore, the voltage between the gates of the transistors 306 and 310, i.e. the voltage across the resistors 320 and 324, remains substantially constant, and can be called the reference voltage $i_{ref}$. Although the difference in the voltages between the gates of the transistors 306 and 310 remains the same, the absolute values of the voltages at the gates of the transistors 306 and 310 can be controlled by the voltage at the node 322 between the resistors 320 and 324.

Figure 6:
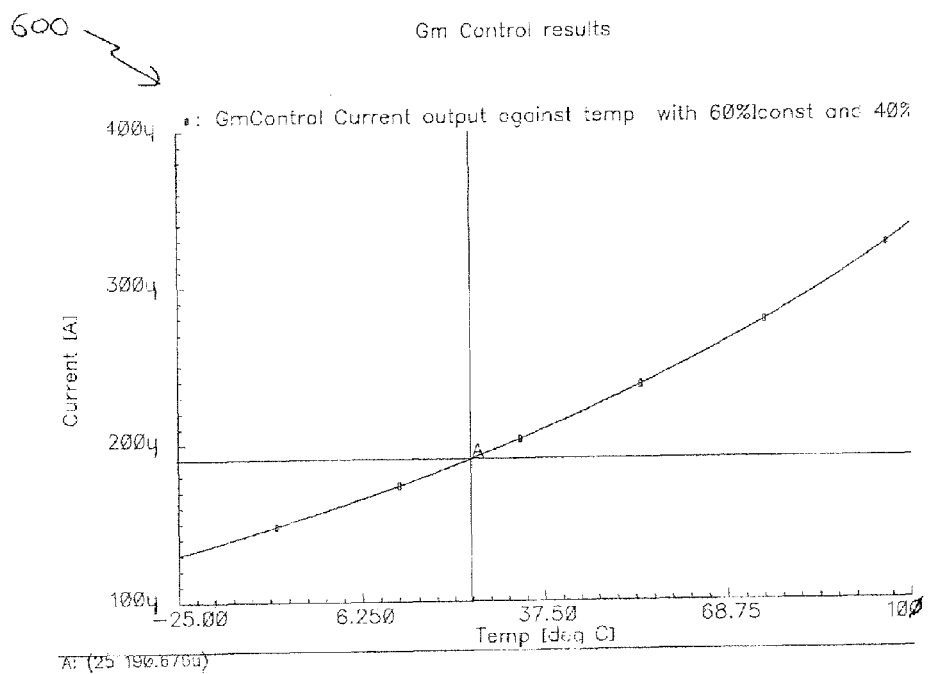
FIG. 6 shows an example of the change in transconductance circuit control current with changes in temperature.

FIG. 6 shows a graph 600 of the variation in the current $i_d$ with changes in temperature from −25° C. to 100° C., when the current $i_{ref}$ is chosen as an example to comprise of 60% $i_{fixed}$ and 40% $i_{PTAT}$ at room temperature. In the example, at room temperature, $i_{fixed}$=18 μA and $i_{PTAT}$=12 μA, although the value of $i_{PTAT}$ will change with changes in temperature. The reference voltage $V_{ref}$ is chosen in this example to be 30 mV. As shown in FIG. 6, the current $i_d$ increases as the temperature increases.

Figure 7:
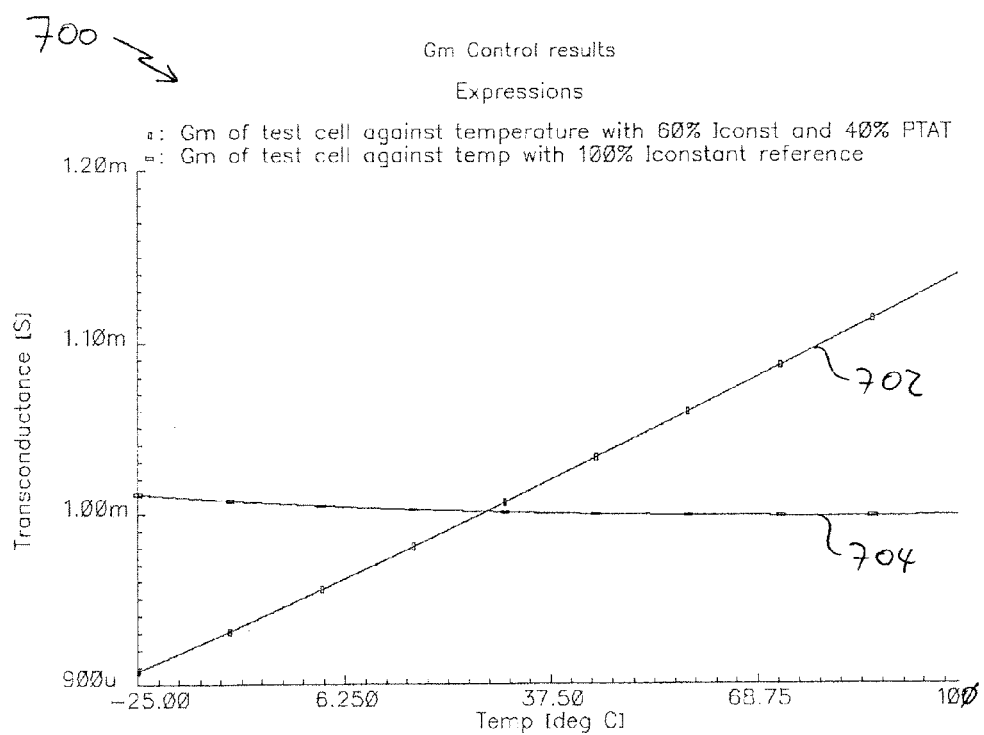
FIG. 7 shows examples of the change in transconductance of a transconductance circuit with changes in temperature.

FIG. 7 shows a graph 700 of the transconductance $g_m$ of the test transconductance circuit as the temperature increases from −25° C. to 100° C. A first curve 702 shows an example of the transconductance where the current $i_{ref}$ is chosen to comprise of 60% $i_{fixed}$ and 40% $i_{PTAT}$ at room temperature. The transconductance $g_m$ increases substantially linearly with temperature. The gradient of the curve 702 may be selected by varying the proportion of $i_{fixed}$ to $i_{PTAT}$ in the reference current $i_{ref}$ at room temperature. The gradient may be selected, for example, to compensate for a decrease in load impedance of a power amplifier and to keep the gain of the power amplifier substantially constant.

A second curve 704 shows an example of the transconductance of the test transconductance circuit where the reference current $i_{ref}=i_{fixed}$, i.e. the reference current does not include a component proportional to absolute temperature, or that component is set to zero. The transconductance of the transconductance is, in this example, substantially constant, and varies by only approximately 1% when the temperature changes from −25° C. to 100° C. The transconductance does not vary substantially with temperature because, as indicated above, the transconductance $g_m$ is maintained close to $i_{ref}/V_{ref}$, and both $i_{ref}$ and $V_{ref}$ in this example are independent of temperature.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A transconductance control circuit, comprising:
    a test transconductance circuit for providing an output current from a reference voltage;
    apparatus for deriving a bias current for the test transconductance circuit from the output current, the bias current including a component that varies with temperature and a component that varies with
    process, wherein the apparatus for deriving the bias current comprises apparatus for determining a difference current representing the difference between the output current and a reference current, the reference current including a component that varies with temperature, and a current amplifier for amplifying the difference current to produce the bias current; and
    apparatus for providing the bias current to other transconductance circuits.

2. A circuit as claimed in claim 1, wherein the bias current includes a component independent of temperature and process.

3. A circuit as claimed in claim 2, wherein the relative magnitudes of the component that varies with temperature and the component independent of temperature and process are selectable.

4. A circuit as claimed in claim 1, wherein the reference current includes a component independent of temperature and process.

5. A circuit as claimed in claim 4, wherein the relative magnitudes of the component that varies with temperature and the component independent of temperature and process are selectable.

6. A circuit as claimed in claim 1, wherein the apparatus for providing the bias current to other transconductance circuits comprises at least one current mirror.

7. A circuit as claimed in claim 1, wherein the reference voltage is a differential voltage and the test transconductance circuit is a differential circuit that produces the output current from the differential reference voltage, wherein the output current is a differential current.

8. A method of controlling transconductance of a transconductance circuit, comprising:
    producing an output current from a reference voltage using a test transconductance circuit;
    deriving a bias current for the test transconductance circuit from the output current, wherein the bias current includes a component that varies with temperature and a component that varies with wherein deriving the bias current comprises determining a difference current representing a difference between the output current and a reference current, the reference current including a component that varies with temperature, and amplifying the difference current to produce the bias current; and
    providing the bias current to other transconductance circuits.

9. A method as claimed in claim 8, wherein the bias current includes a component independent of temperature and process, and the method comprises selecting the relative magnitudes of the component that varies with temperature and the component independent of temperature and process.

10. A power amplifier, comprising:
    a power transconductance circuit;
    a load impedance; and a gain control circuit, comprising: a test transconductance circuit for providing an output current from a reference voltage; apparatus for deriving a bias current for the transconductance circuit, the bias current including a component that varies with temperature and a component that varies with process, wherein the apparatus for deriving the bias current comprises apparatus for determining a difference current representing a difference between the output current and a reference current, the reference current including a component that varies with temperature, and a current amplifier for amplifying the difference current to produce the bias current; and apparatus for providing the bias current to the power transconductance circuit to control the gain of the power amplifier.

11. A power amplifier as claimed in claim 10, wherein the bias current includes a component independent of temperature and process.

12. A power amplifier as claimed in claim 11, wherein the relative magnitudes of the component that varies with temperature and the component independent of temperature and process are selectable.

13. A power amplifier as claimed in claim 10, wherein the reference current includes a component independent of temperature and process.

14. A power amplifier as claimed in claim 13, wherein the relative magnitudes of the component that varies with temperature and the component independent of temperature and process are selectable.

15. A power amplifier as claimed in claim 10, wherein the apparatus for providing the bias current to other transconductance circuits comprises at least one current mirror.

16. A power amplifier as claimed in claim 10, wherein the reference voltage is a differential voltage and the test transconductance circuit is a differential circuit that produces the output current from the differential reference voltage, wherein the output current is a differential current.

17. A power amplifier as claimed in claim 12 or 14, wherein the relative magnitudes of the component that varies with temperature and the component independent of temperature and process are selected such that the power amplifier has a gain substantially independent of temperature and process.

18. A power amplifier comprising:
a power transconductance circuit;
a load impedance; and
a gain control circuit, comprising: a test transconductance circuit for providing an output current from a reference voltage; apparatus for subtracting the output current from a reference current to produce an error current, wherein the reference current includes a component that varies with temperature and a component independent of temperature and process; a current amplifier for amplifying the error current to produce the bias current; and a current mirror for providing the bias current to the power transconductance circuit to control the gain of the power amplifier;
wherein the relative magnitudes of the component that varies with temperature and the component independent of temperature and process are selected such that the gain of the power amplifier is substantially independent of temperature and process.

19. A transconductance control circuit, comprising:
a test transconductance circuit for producing an output current $i_{ref}$ from a reference voltage $V_{ref}$;
apparatus for determining an error current representing a difference between the output current and a reference current;
an amplifier for amplifying the error current to produce a bias voltage for the test transconductance circuit; and
apparatus for providing the bias current to other transconductance circuits;
wherein the transconductance of the transconductance circuit is maintained at substantially $i_{ref}/V_{ref}$.

* * * * *